United States Patent [19]
Honma et al.

[11] Patent Number: 5,125,357
[45] Date of Patent: Jun. 30, 1992

[54] DEVELOPER MATERIAL COATING APPARATUS HAVING COATING AMOUNT CONTROL UNIT

[75] Inventors: Yoshiyasu Honma; Shigeru Kagayama, both of Nagoya, Japan

[73] Assignee: Brother Kogyo Kabushiki Kaisha, Aichi, Japan

[21] Appl. No.: 497,986

[22] Filed: Mar. 23, 1990

[30] Foreign Application Priority Data

Mar. 28, 1989 [JP] Japan .................. 1-75582
Mar. 31, 1989 [JP] Japan .................. 1-83720
Mar. 31, 1989 [JP] Japan .................. 1-83721

[51] Int. Cl.$^5$ ............................. G03G 15/06
[52] U.S. Cl. ..................... 118/621; 118/624; 118/638; 118/651; 118/653
[58] Field of Search ........... 118/50.1, 621, 624–625, 118/638, 644, 647–649, 651–653, 661, 665–667, 669, 677–679; 355/245, 259, 265, 312

[56] References Cited

U.S. PATENT DOCUMENTS

| | | | |
|---|---|---|---|
| 3,837,741 | 9/1974 | Spencer | 118/638 |
| 4,878,598 | 11/1989 | Ruschhaupt, Jr. | 118/679 |
| 4,957,770 | 9/1990 | Howorth | 162/263 |

Primary Examiner—W. Gary Jones
Assistant Examiner—Charles K. Friedman
Attorney, Agent, or Firm—Oliff & Berridge

[57] ABSTRACT

A developer material coating apparatus for electrostatically coating developer material on each of various kinds of support members having different thicknesses and surface conditions under various environmental conditions such as temperature and humidity in a developer material coating region to form a developer sheet, comprising a support member feeding unit for feeding each of the support members to the developer material coating region at a feeding speed while carrying the support member thereon, a developer material coating unit for triboelectrically charging the developer material while carrying the charged developer material thereon, and electrostatically supplying the charged developer material therefrom to the support member through a gap between the feeding unit and the coating unit to thereby form a developer sheet, and a control unit for controlling an amount of the developer material to be coated on the support member so that the developer material coated on the support member has a predetermined thickness irrespective of the change in the environmental conditions, the thickness of the support member and the kind of the support member.

13 Claims, 7 Drawing Sheets

DEVELOPER MATERIAL COATING APPARATUS HAVING COATING AMOUNT CONTROL UNIT

BACKGROUND OF THE INVENTION

This invention relates to a developer material coating apparatus for coating a support member such as a plain paper with granular developer material, and more particulary to a developer material coating apparatus having a coating amount control unit for freely adjusting the amount of the developer material to be coated on the support member.

There has been recently utilized a color copying machine in which a color image is formed on a support member such as plain paper using granular developer material and a microcapsule sheet. A color image forming process of this type of color copying machine is as follows. A developer sheet is beforehand formed by coating the developer material on the support member such as plain paper, and the microcapsule sheet is exposed through an original to light to form a latent image on the microcapsule sheet. The microcapsule sheet having the latent image thereon and the developer sheet comprising the support member coated with the developer material are fed to a pressure-developing unit while contacted with each other. In the pressure-developing unit, the microcapsule sheet and the developer sheet are subjected to a pressure-developing process to develop the latent image on the microcapsule sheet into a visible color image on the developer sheet. Thereafter, the developer sheet having the visible color image thereon is fed to a heat-fixing unit to thermally fix the visible color image on the developer sheet. The developer material is formed of, for example, acid clay, binder and so on, and thus the developer sheet may comprise the support member coated with the developer material formed of the acid clay, the binder and so on.

As described above, this type of color copying machine requires a process for coating the developer material on the support member such as plain paper, and thus a coating apparatus therefor. As a coating apparatus, there has been conventionally used a coating apparatus in which the developer material on the support member is charged with triboelectrification and then is electrostatically coated on the support member.

Figure 1:
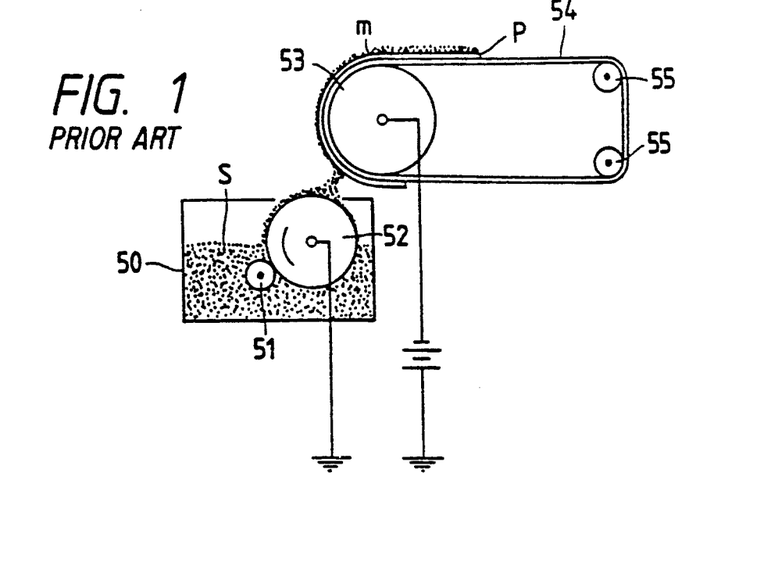
FIG. 1 shows a conventional developer material coating apparatus.

FIG. 1 shows a conventional coating apparatus for coating the developer material on the support member such as plain paper. This coating apparatus comprises, for example, a support member feeding unit for feeding the support member to a developer material coating region in which the support member is electrostatically coated with the developer material and then discharging the support member coated with the developer material to an outside of the coating apparatus, and a developer material coating unit for triboelectrically charging the developer material and electrostatically coating the charged developer material on the support member.

The developer material coating unit comprises a tank (hopper) 50 for accommodating the developer material S therein, a carry roller 52 for carrying the developer material thereon and a supply roller 51 for triboelectrically charging the developer material in cooperation with the carry roller 52 and supplying the charged developer material to the carry roller 52. The carry roller 52 is grounded as shown in FIG. 1. The carry roller 52 and the supply roller 51 are rotatably contacted with each other at the peripheral surfaces thereof, and the developer material S is triboelectrically charged at a predetermined polarity (positively or negatively) at the contacted surfaces of the rollers 51 and 52 through a friction between the surface of the carry roller 52 and the developer material S. The charged developer material S is attached to peripheral surface of the carry roller 52 and then is fed to the developer material coating region while carried on the carry roller.

The support member feeding unit comprises a counter electrode roller 53, which is supplied with a voltage having the opposite polarity to that of the charged developer material from a D.C. power source, a pair of guide rollers 55 provided away from the counter roller 53 and a carry belt 54 such as an endless belt for feeding the support member to the developer material coating region while carrying the support member P thereon and discharging the support member coated with the developer material (developer sheet) to the outside of the coating apparatus, the carry belt 54 being suspended among the counter roller 53 and the guide rollers 55 and 56. In FIG. 1, since the developer material S is positively charged, the counter electrode roller 53 is supplied with a negative voltage.

The support member P carried on the carry belt 54 is fed to the developer material coating region by the rotation of the counter roller 53 and the guide rollers 55. The positively-charged developer material S on the carry roller 52 is electrostatically attracted toward the counter electrode roller 53 due to an electric field which is caused between the counter roller 53 having a positive potential and the grounded carry roller 52. That is, particles of the positively-charged developer material S is electrostatically attracted (flight) toward the counter electrode roller 53 in the developer material coating region where the counter roller 53 and the carry roller 52 are confronted to each other, and attach to the support member P to form a developer material layer m on the support member P, that is, a developer sheet.

In a practical use of the image forming apparatus including the developer material coating apparatus thus constructed, it is required to accurately and stably obtain an visible image corresponding to an original image that a constant or optimum amount of the developer material P be constantly coated on the support member P, that is, a constant or optimum thickness of the developer material S be coated on the support member P, irrespective of characteristics of the support member such as kind, thickness and surface condition of the support member and environmental conditions such as temperature, humidity and so on. However, the above conventional developer material coating apparatus, as described below, has not been satisfied for the above requirements.

For example, in the conventional developer material coating apparatus, an amount of the developer material S to be coated on the support member P (hereinafter referred to as "a coating amount") is changed in accordance with the change of the temperature or the humidity within the coating apparatus. In general, a charging amount of the developer material S is changed in accordance with the change of temperature, humidity or the like, and the change of the charging amount of the developer material S causes the change of an amount of the developer material to be carried on the carry roller and thus coated on the support member. For example, if the humidity in the coating apparatus rises in accordance with increase of the temperature in the coating apparatus, then the charging amount of the developer material S is decreased, and therefore the thickness of the developer material layer m on the support member P is smaller than that of the developer material layer m coated on the support member P at a room temperature. That is, the coating amount of the developer material S on the support member P is changed in accordance with the change of the temperature or the humidity, and thus a stable image can not be constantly obtained.

Further, in the conventional developer material coating apparatus, the coating amount of the developer material S on the support member P is changed in accordance with the thickness of the support member P for the following reason. The distance of a gap between the carry roller 52 and the support member P which is fed to the developer material coating region is changed in accordance with the thickness of the support member P itself, and the change in the distance of the gap causes the change of the amount of the developer material S to be coated on the support member P. As a result, a constant thickness of the developer material layer m can not be obtained on the support members having different thicknesses.

Still further, in the conventional developer material coating apparatus, an amount (or thickness) of the developer material to be coated on any kind of support member can not be changed in accordance with the kind of the support member or a surface condition (for example, a rough surface, a flat surface or the like) of the support member. Therefore, irrespective of the differences in the kind of the support member and the surface condition thereof, the same amount of the developer material has been constantly coated on any kind of support member such as a rough sheet having a rough surface of a rough fiber arrangement, a plastic sheet such as an OHP sheet having a flat surface and so on. Therefore, it easily occurs in some kinds of support members that the image surface on each of the support members becomes rough, and the developer material on the support member after pressure-developed is exfoliated from the support member to damage the image on the support member.

SUMMARY OF THE INVENTION

An object of this invention is to provide a developer material coating apparatus in which a constant amount of the developer material is coated on a support member irrespective of the change in temperature, humidity and other environmental conditions.

Another object of this invention is to provide a developer material coating apparatus in which a constant amount of the developer material is coated on a support member irrespective of the thickness of the support member.

Still another object of this invention is to provide a developer material coating apparatus in which an optimum amount of the developer material is coated on a support member in accordance with the kind of the support member.

In order to attain the above object, the developer material coating apparatus according to this invention for electrostatically coating developer material under a changeable condition comprising at least one of a kind of a support member, a thickness of the support member, a surface condition of the support member and an environmental condition such as temperature and humidity in a developer material coating region to form a developer sheet, comprising, feeding means for feeding each of the support members to the developer material coating region at a feeding speed while carrying the support member thereon, coating means for triboelectrically charging the developer material while carrying the charged developer material thereon, and electrostatically supplying the charged developer material therefrom to the support member through a gap between the feeding means and the coating means to thereby form a developer sheet, and control means for controlling an amount of the developer material to be coated on the support member so that the developer material coated on the support member has a predetermined thickness irrespective of the change in the condition.

DETAILED DESCRIPTION OF THE INVENTION

The preferred embodiments of this invention will be described hereunder with reference to the accompanying drawings.

Figure 2:
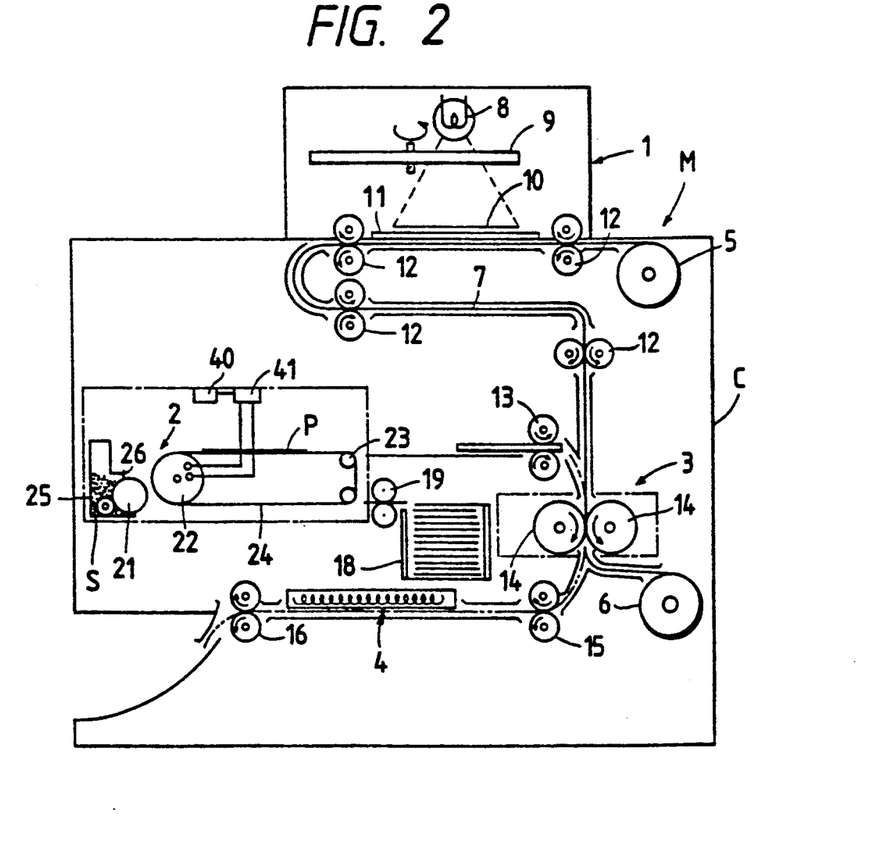
FIG. 2 shows a first type of image recording apparatus adopting the developer material coating apparatus according to this invention.

FIG. 2 shows a first type of color image forming apparatus M provided with one embodiment of the developer material coating apparatus of this invention.

The color image forming apparatus M comprises an exposure unit 1 provided at an upper portion of the apparatus for exposing a microcapsule (photosensitive and pressure-sensitive) sheet 7 traveling between a sheet supply roller 5 and a sheet take-up roller 6 to a image light from an original 10, and a casing C for accommodating the developer material coating apparatus 2 provided substantially at the center of the casing C, a pressure-developer unit 3 provided beside the coating apparatus 2, and other elements for an image forming process.

In the pressure-developing unit 3, the microcapsule sheet 7 which has been exposed to the image light from the original 10 is contacted under pressure with a developer sheet P which is formed of a support member and a developer material layer m in the coating apparatus 2, to thereby develop a latent image on the microcapsule sheet 7 into a visible image on the developer sheet. After the pressure-developing process, the developer sheet is separated from the microcapsule sheet 7 and fed to a heat-fixing unit 4 to thermally fix the visible image on the developer sheet.

The exposure unit 1 includes a halogen lamp 8 and a rotatable color separation filter unit 9 provided below the halogen lamp 8 for passing a light emitted from the halogen lamp 8 therethrough and separating the light into three primary color components. Below the color separation filter unit 9, the original 10 is disposed on an original stand 11. Two pairs of first and second guide rollers 12 are provided beside both sides of the original stand 11 (beside the right and left sides of the original in the FIG. 2) and other guide rollers 12 are further provided downstream of the second guide rollers 12 along a sheet feed path.

The microcapsule sheet 7 is drawn out of the sheet supply roll 5 and is fed through the first guide rollers 12 to the original stand 11 for an exposure process to thereby form a latent image corresponding to an original image on the microcapsule sheet 7. The microcapsule sheet having the latent image thereon is further fed through the second guide rollers 12 and the other guide rollers 12 to the pressure-developing unit 3.

On the other hand, the developer sheet is formed of a support member P such as plain paper and a developer material layer m coated thereon in the developer material coating apparatus 2 in a manner as described hereinafter and fed through a pair of guide rollers 13 to a gap between a pair of pressure rollers 14 of the pressure-developing unit 3 while superposed on the microcapsule sheet 7. The pressure development is conducted on these superposed sheets under a pressure of the pressure rollers 14.

The microcapsule sheet 7 passed through the pressure-developing unit 7 is taken up by the sheet take-up roller 6. On the other hand, the developer sheet passed through the pressure-developing unit 3 is fed through a pair of guide rollers 15 to the heat-fixing unit 4, and then discharged through a pair of guide rollers 16 to an outside of the apparatus.

FIGS. 3-6 show the detailed construction of a first embodiment of the developer material coating apparatus of this invention, and show various control modes for adjusting the coating amount of the developer material on the support member.

Figure 3:
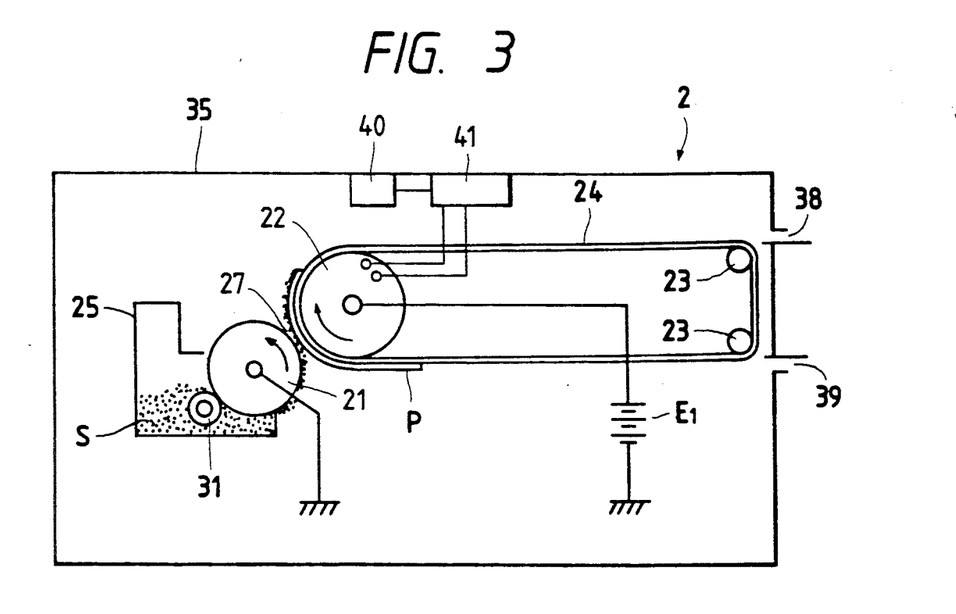
FIG. 3 shows a first embodiment of the developer material coating apparatus in which a first control mode for adjusting a coating amount of the developer material is used.

FIG. 3 shows the developer material coating apparatus adopting a first control mode for adjusting the coating amount of the developer material. The developer material coating apparatus as shown in FIG. 3 includes a developer material coating unit, a support member feeding unit and a casing 35 for accommodating the above units. The casing 35 has at the side portion thereof a sheet inlet 39 for inserting a support member therethrough and a sheet outlet 38 for discharging the support member therethrough.

The developer material coating unit includes a tank (hopper) 25 for accommodating granular developer material S therein, a rotatable carry roller 21 for carrying the developer material S thereon and a supply roller 31 for triboelectrically charging the developer material S in cooperation with the carry roller 21. The carry roller 21 is disposed at a side portion of the tank 25 in such a manner as to confront a counter electrode roller 22 as described later, and the supply roller 31 is disposed in the tank 25 in such a manner as to be contacted with the carry roller 21 under pressure.

The support member feeding unit includes a counter electrode roller 22 spaced at a predetermined interval away from the carry roller 21, a pair of guide rollers 23 disposed near to the sheet inlet 39 and the sheet outlet 38, and a carry belt 24 suspended around the counter electrode roller 22 and the guide rollers 23 for carrying the support member P thereon. The carry belt 24 comprises, for example, an endless belt. The support member P inserted through the sheet inlet 39 is fed to a developer material coating region 27 which is defined as a space between the counter electrode roller 22 and the carry roller 21, and discharged through the sheet outlet 38 to an outside of the coating apparatus 2.

As shown in FIG. 3, the carry roller 21 is grounded, and the counter electrode roller 22 is supplied with a positive voltage from a voltage source El, so that an electric field (hereinafter referred to as "transfer electric field") occurs in the developer material coating region between the carry roller 21 and the counter electrode roller 22.

In addition to the above elements constituting the developer material coating apparatus, the developer material coating apparatus of this invention is further provided with various detectors for detecting the environmental conditions such as temperature, humidity, etc. and characteristics of the support member inserted through the sheet inlet 39 such as the thickness, the surface condition, the kind of the support member and etc. and outputting signals representing the detection results, and at least one control unit for controlling some elements of the developer material coating apparatus to adjust an amount of the developer material S to be coated on the support member P. In place of the detectors, data on the environmental conditions and the characteristics of the support member such as the surface condition and the kind of the support member may be manually inputted to the control unit by an user as described later.

In the embodiment as shown in FIG. 3, a detector 40 for detecting the temperature and humidity within the coating apparatus 2 is provided at the upper portion of the coating apparatus 2, and a control unit 41 connected to the detector 40 is provided in the coating apparatus 2. The control unit 41 is connected to the counter electrode roller 22 through a rotating mechanism (not shown) for the counter electrode roller 22 such as a motor, and controls the counter electrode roller 22 so that the number of rotations (rotational speed) of the counter electrode roller 22 is changed. Accordingly, in this embodiment, the control unit 41, the rotating mechanism and the counter electrode roller 22 constitutes a coating amount control means.

The operation of the developer material coating apparatus of this embodiment will be described hereunder.

The developer material S is triboelectrically charged at a contact portion of the carry roller 21 and the supply roller 31 through the rotation of these rollers 21 and 31, and then the charged developer material S is homogeneously attached on the surface of the carry roller 21. On the other hand, the support member P inserted through the sheet inlet 39 is fed to the developer material coating region 27 by the carry belt 24. The charged developer material S on the carry roller 21 is fed to the developer material coating region 27 and then is electrostatically attracted toward the counter electrode roller 31 because the counter electrode roller 31 is supplied with a voltage having the opposite polarity to that of the charged developer material S. In this embodiment, the developer material S is negatively charged, and therefore the positive voltage is applied to the counter electrode roller 22 by the voltage source E1. The electrostatically attracted developer material S is attached on the surface of the support member P which has been fed to the developer material coating region 27.

In general, the change of the temperature and humidity in the coating apparatus 2 causes the change in a charging amount of the developer material S, and thus causes the change in an amount of the developer material S to be coated on the support member P. For example, when both of the temperature and the humidity rise, that is, the environment within the coating apparatus 2 becomes a high temperature and humidity condition, the charging amount of the developer material S is decreased and thus the coating amount of the developer material on the support member P is decreased. In this case, if the feeding speed of the support member P (the rotational speed of the counter electrode roller 22) is controlled by the control unit 41 to be reduced to a value suitable for the current temperature and humidity, so that a constant amount of the developer material is constantly coated on the support member P irrespective of the temperature and humidity. After a series of developer material coating processes, the support member P coated with a developer material layer having a constant thickness (that is, a developer sheet) is discharged through the sheet outlet 38 to the outside of the coating apparatus 2.

Figure 4:
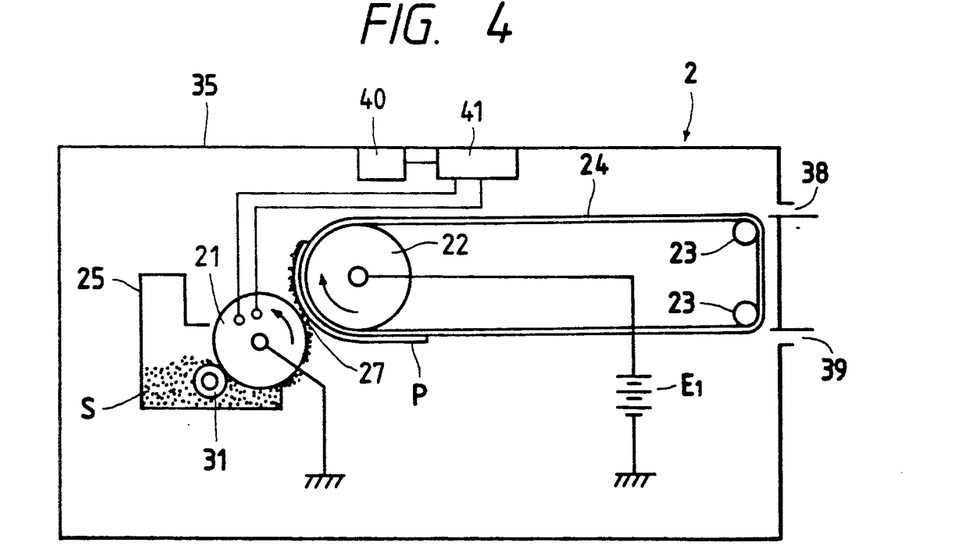
FIG. 4 shows the first embodiment of the developer material coating apparatus in which a second control mode for adjusting a coating amount of the developer material is used.

FIG. 4 shows the developer material coating apparatus adopting a second control mode for adjusting the coating amount of the developer material. The elements having the same functions as those of the developer material coating apparatus as shown in FIG. 3 are represented by the same reference numerals, and the description thereof is eliminated.

A different point from the developer material coating apparatus as shown in FIG. 3 is only a control mode for adjusting the coating amount of the developer material S. In the developer material coating apparatus of this invention, in place of changing the number of rotations (rotional speed) of the counter electrode roller 22 in accordance with the temperature and humidity, the number of rotations (rotional speed) of the carry roller 21 is changed through a rotating mechanism (not shown) for the carry roller 21 by the control unit 41. The rotating mechanism for the carry roller 21 may be identical to the rotating mechanism for the counter electrode roller 22 or different therefrom.

Like the control mode as shown in FIG. 3, the developer material coating apparatus adopting this mode is also provided with the detector 40 and the control unit 41. However, the control unit 41 is connected to the carry roller 21 through the rotating mechanism for the carry roller 21 and controls the rotating mechanism to change the number of rotations (rotional speed) of the carry roller 21 in accordance with the detection signal from the detector 40. Accordingly, the coating amount control means of this mode comprises the control unit 41, the rotating mechanism and the carry roller 21. Like the developer material coating apparatus as shown in FIG. 3, the constant amount of the developer material S can be coated on the support member P, that is, the developer material layer having a constant thickness can be formed on the support member P by adjusting the rotational speed of the carry roller 21 to a value suitable for the current temperature and humidity.

Figure 5:
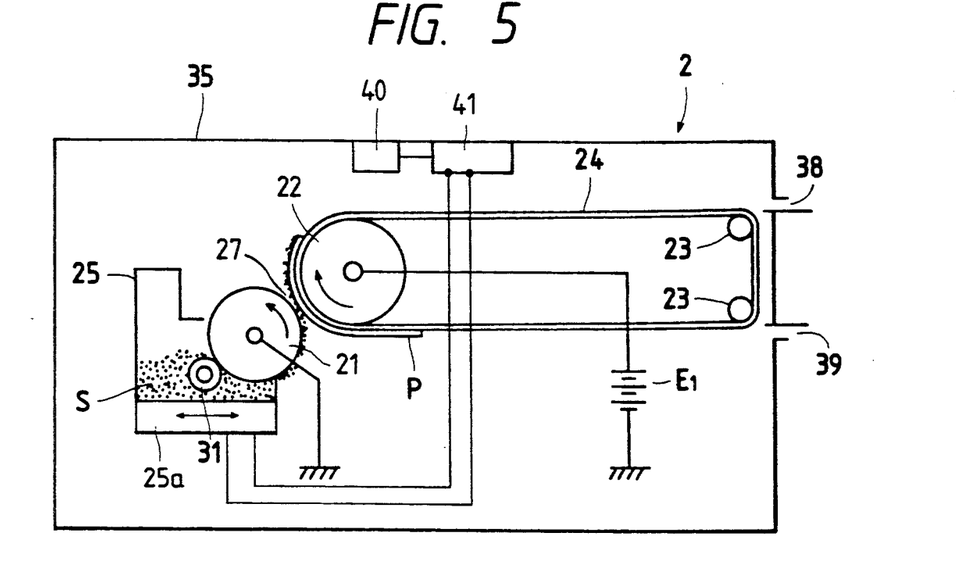
FIG. 5 shows the first embodiment of the developer material coating apparatus in which a third control mode for adjusting a coating amount of the developer material is used.

FIG. 5 shows the developer material coating apparatus adopting a third control mode for adjusting the coating amount of the developer material.

In this developer material coating apparatus is further provided a moving means 25a for moving the tank 25 in such a direction that the carry roller 21 approaches to or goes away from the counter electrode roller 22 to shorten or lengthen interval (distance) between the carry roller 21 and the counter electrode roller 22. The moving means is connected to the control unit 41 and controlled by the control unit 41 in accordance with the detected temperature and humidity. Accordingly, the coating amount control means of this mode comprises the moving means 25a and the control unit 41. That is, in accordance with the detection signal representing the detected temperature and humidity by the detector 40, the control unit 40 outputs an instruction signal to the moving means 25a to adjust the interval between the carry roller 21 and the counter electrode roller 22 so that the constant amount of the developer material S is coated on the support member P, that is, the developer material layer having a constant thickness is coated on the support member P irrespective of the change in temperature and humidity.

Figure 6:
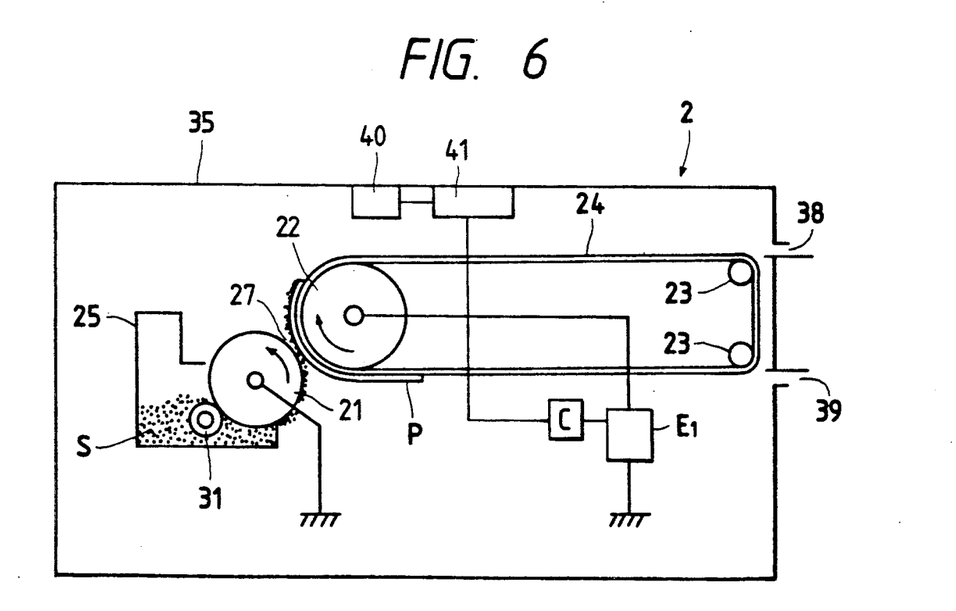
FIG. 6 shows the first embodiment of the developer material coating apparatus in which a fourth control mode for adjusting a coating amount of the developer material is used.

FIG. 6 shows the developer material coating apparatus adopting a fourth control mode for adjusting the coating amount of the developer material.

In this mode, the control unit 41 is connected to the voltage source E1 through a voltage control means (not shown) for the voltage source E1, and controls the voltage control means to change the intensity of the transfer electric field between the carry roller 21 and the counter electrode roller 22 so that the constant amount of the developer material S is coated on the support member S, that is, the developer material layer having a constant thickness is formed on the support member S. In this mode, the coating amount control means comprises the control unit 41 and the voltage control means. The voltage control means may be any kind of a well-known element insofar as the voltage outputted from the voltage source E1 can be changed.

In the developer material coating apparatus as described above, each of the above control modes for adjusting the coating amount of the developer material is individually adopted, however, may be adopted in combination.

FIGS. 7-10 show a second embodiment of the developer material coating apparatus adopting the four control modes as described above, respectively. In FIGS. 7-10, the same elements as shown in FIGS. 3-6 have the same functions as described above, and are represented by the same reference numerals.

In this embodiment, a detector 50 for detecting the thickness of the support member P is provided in the developer material coating apparatus 2. The detector 50 comprises, for example, a pair of detection rollers 51 disposed at the opposite positions with respect to the carry belt 24 such that they sandwich the carry belt 24 therebetween. The thickness of the support member P is detected by monitoring the change of a gap between the detection rollers 51. The detector 50 is connected to the control unit 41, and outputs a detection signal representing the thickness of the support member P to the control unit 41.

The amount of the developer material S to be coated on the support member P is adjusted in accordance with the control operation of the control unit 41. The same control modes of adjusting the coating amount of the developer material as shown in FIGS. 3-6 can be also adopted in this embodiment.

Figure 7:
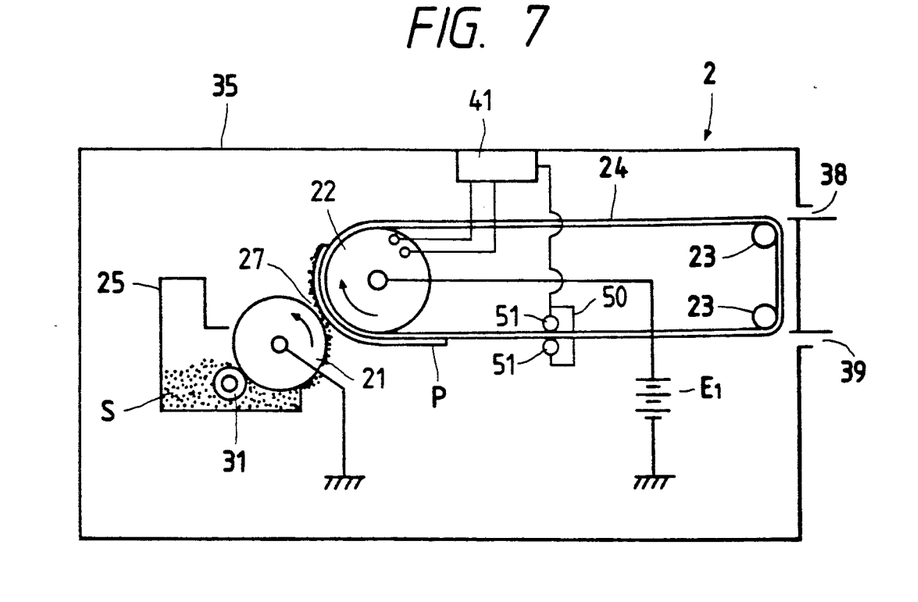
FIG. 7 shows a second embodiment of the developer material coating apparatus in which the first control mode for adjusting a coating amount of the developer material is used.

FIG. 7 shows the developer material coating apparatus adopting the first control mode. Like the developer material coating apparatus as shown in FIG. 3, in response to a detection signal from the detector 50, the control unit 41 controls the rotating mechanism for the counter electrode roller 22 to change the feeding speed of the support member (the rotational speed of the counter electrode roller) to a value suitable for the thickness of the support member P, so that the constant amount of the developer material S is coated on the support member P, that is, the developer material layer having a constant thickness is formed on the support member P irrespective of the thickness of the support member P. The support member P coated with the constant amount of the developer material is fed to the sheet outlet 38 and discharged therethrough to the outside of the apparatus 2.

Figure 8:
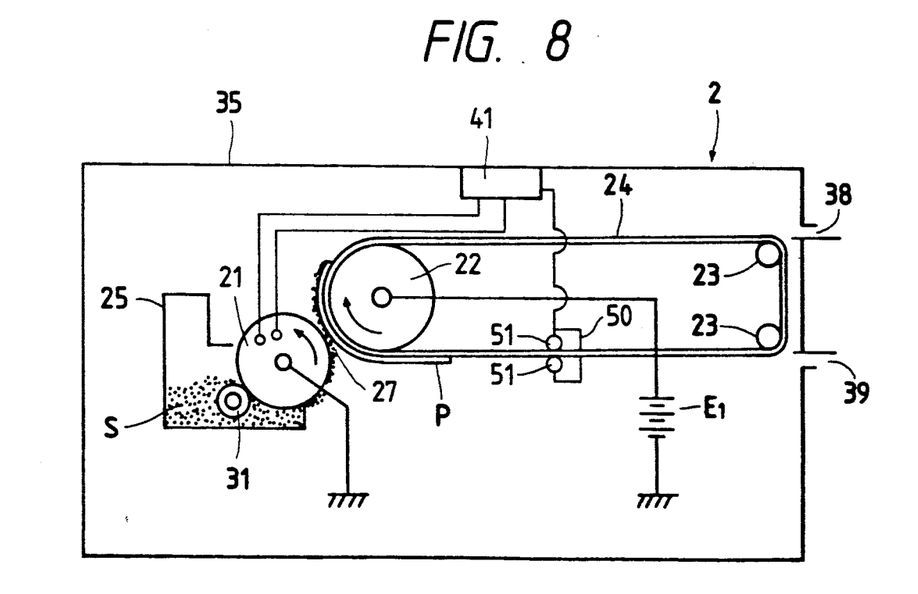
FIG. 8 shows the second embodiment of the developer material coating apparatus in which the second control mode for adjusting a coating amount of the developer material is used.

FIG. 8 shows the developer material coating apparatus adopting the second control mode. Like the developer material coating apparatus as shown in FIG. 4, in response to the detection signal from the detector 50, the control unit 41 controls the rotating mechanism for the carry roller 22 to change the number of rotations (rotational speed) of the carry roller 21 so that the constant amount of the developer material S is coated on the support member P, that is, the developer material layer having a constant thickness is formed on the support member P irrespective of the thickness of the support member P. The support member P coated with the constant amount of the developer material is fed to the sheet outlet 38 and discharged therethrough to the outside of the apparatus 2.

Figure 9:
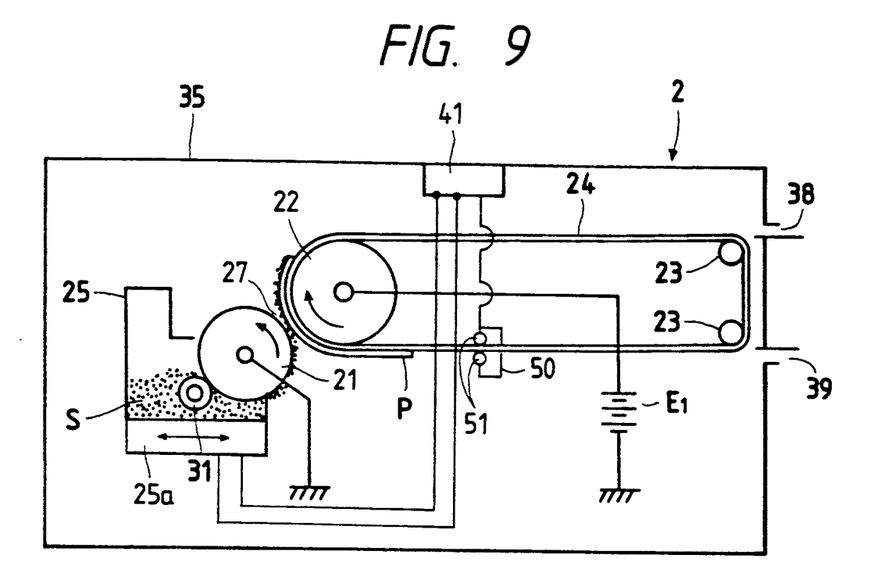
FIG. 9 shows the second embodiment of the developer material coating apparatus in which the third control mode for adjusting a coating amount of the developer material is used.

FIG. 9 shows the developer material coating apparatus adopting the third control mode. Like the developer material coating apparatus as shown in FIG. 5, in response to the detection signal from the detector 50, the control unit 41 controls the moving means 25a for moving the tank 25 to change the interval between the carry roller 21 and the counter electrode roller 22 so that the constant amount of the developer material S is coated on the support member P, that is, the developer material layer having a constant thickness is formed on the support member P irrespective of the thickness of the support member P. The support member P coated with the constant amount of the developer material is fed to the sheet outlet 38 and discharged therethrough to the outside of the apparatus 2.

Figure 10:
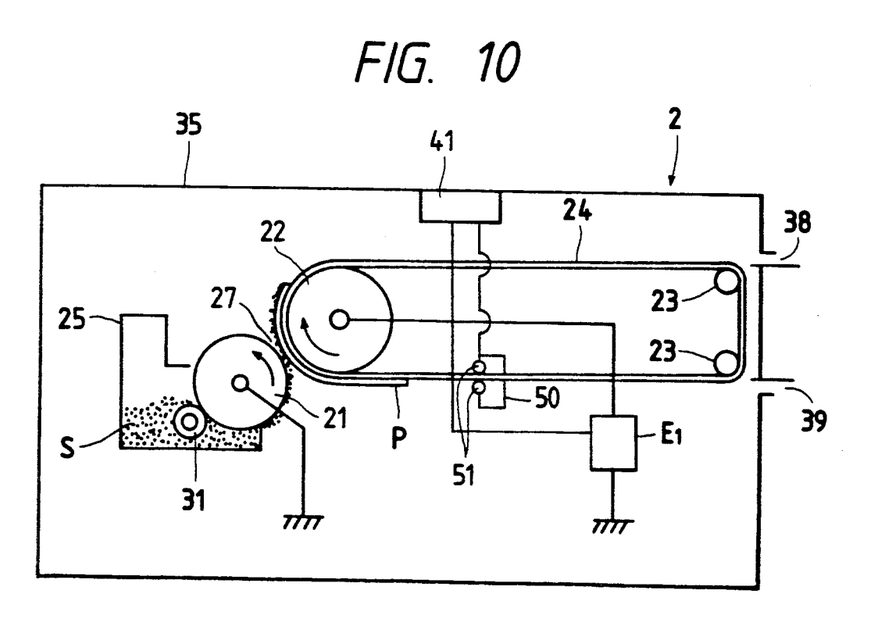
FIG. 10 shows the second embodiment of the developer material coating apparatus in which the fourth control mode for adjusting a coating amount of the developer material is used.

FIG. 10 shows the developer material coating apparatus adopting the fourth control mode. Like the developer material coating apparatus as shown in FIG. 6, in response to the detection signal from the detector 50, the control unit 41 controls the voltage control means for the voltage source E1 to change the voltage to be supplied to the counter electrode roller, that is, to change the intensity of the transfer electric field so that the constant amount of the developer material S is coated on the support member P, that is, the developer material layer having a constant thickness is formed on the support member P irrespective of the thickness of the support member. The support member P coated with the constant amount of the developer material is fed to the sheet outlet 38 and discharged therethrough to the outside of the apparatus 2.

As described above, according to this embodiment, the constant amount of the developer material is coated on the support member irrespective of the thickness of the support member. Accordingly, an image having excellent image quality is constantly and stably formed on the support member irrespective of the thickness of the support member.

The control modes adopted in the first and second embodiments are individually used and thus the control unit 41 is used only for each control mode. However, the control unit may be used to perform the control modes in combination with one another. Further, in place of, or in combination with the detectors 40 and 50, an input switch for inputting to the control unit 41 data on the environmental conditions, and the characteristics of the support member such as the thickness of the support member, the kind of the support member, the surface condition of the support member and so on, may be provided in the developer material coating apparatus.

Figure 11:
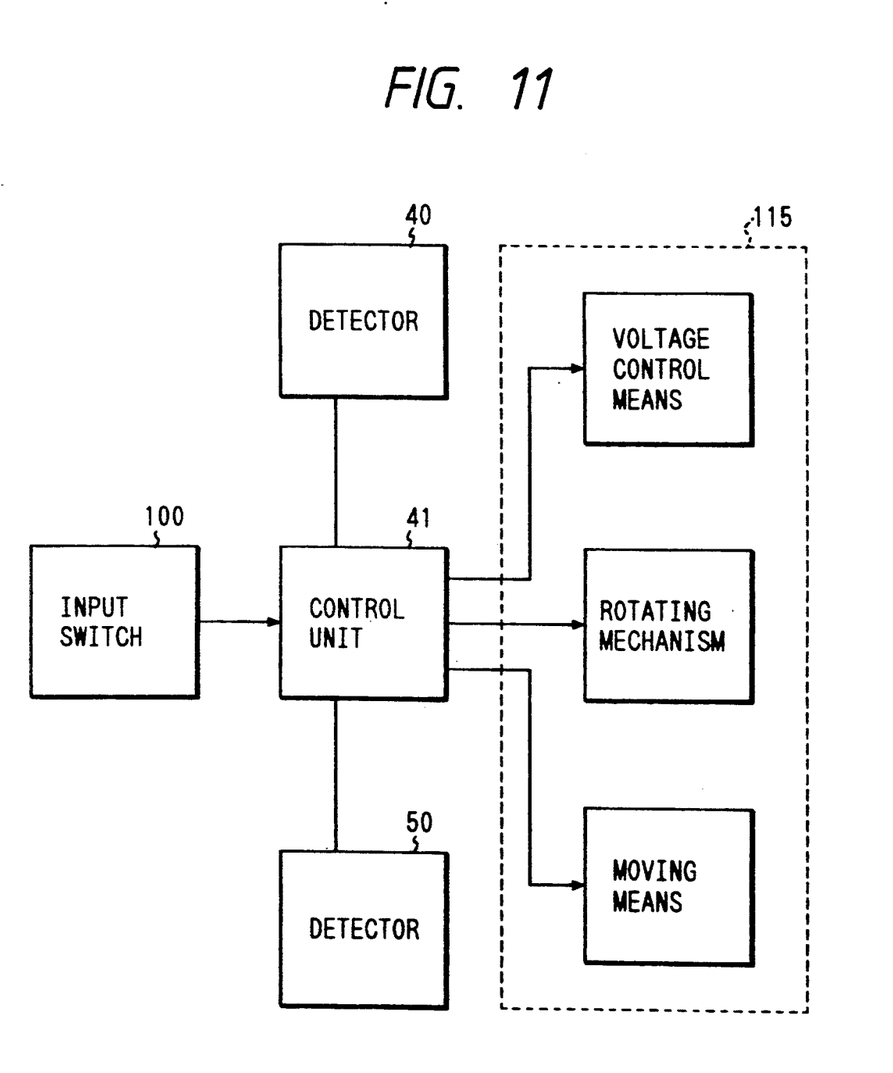
FIG. 11 shows a control system in which the first to fourth control modes are adopted.

FIG. 11 shows a block diagram of the control system for adjusting the coating amount of the developer material in which all of the control modes are adopted in combination with one another in the developer material coating apparatus. The control system includes the input switch 100, the detectors 40 and 50, the control unit 41 and a coating amount control unit 115 comprising the voltage control means, the rotating means for the counter electrode roller and the carry roller, and the moving means. These elements are operated in the same manner as described above.

Further, in the first and second embodiments, the control operation for the coating amount of the developer material is performed so that the coating amount (thickness) of the developer material is constant irrespective of the change of the environmental conditions, the change of the thickness of the support member and so on. However, the control operation as described above may be used so that the coating amount (thickness) of the developer material is intentionally changed. For example, the amount of the developer material to be coated on the support member may be changed in accordance with the kind of the support member such as a rough sheet having a rough surface, an OHP sheet having a flat sheet, etc. so that the coating amount of the developer material which is most suitable for the kind of the support member is coated on the support member.

Figure 12:
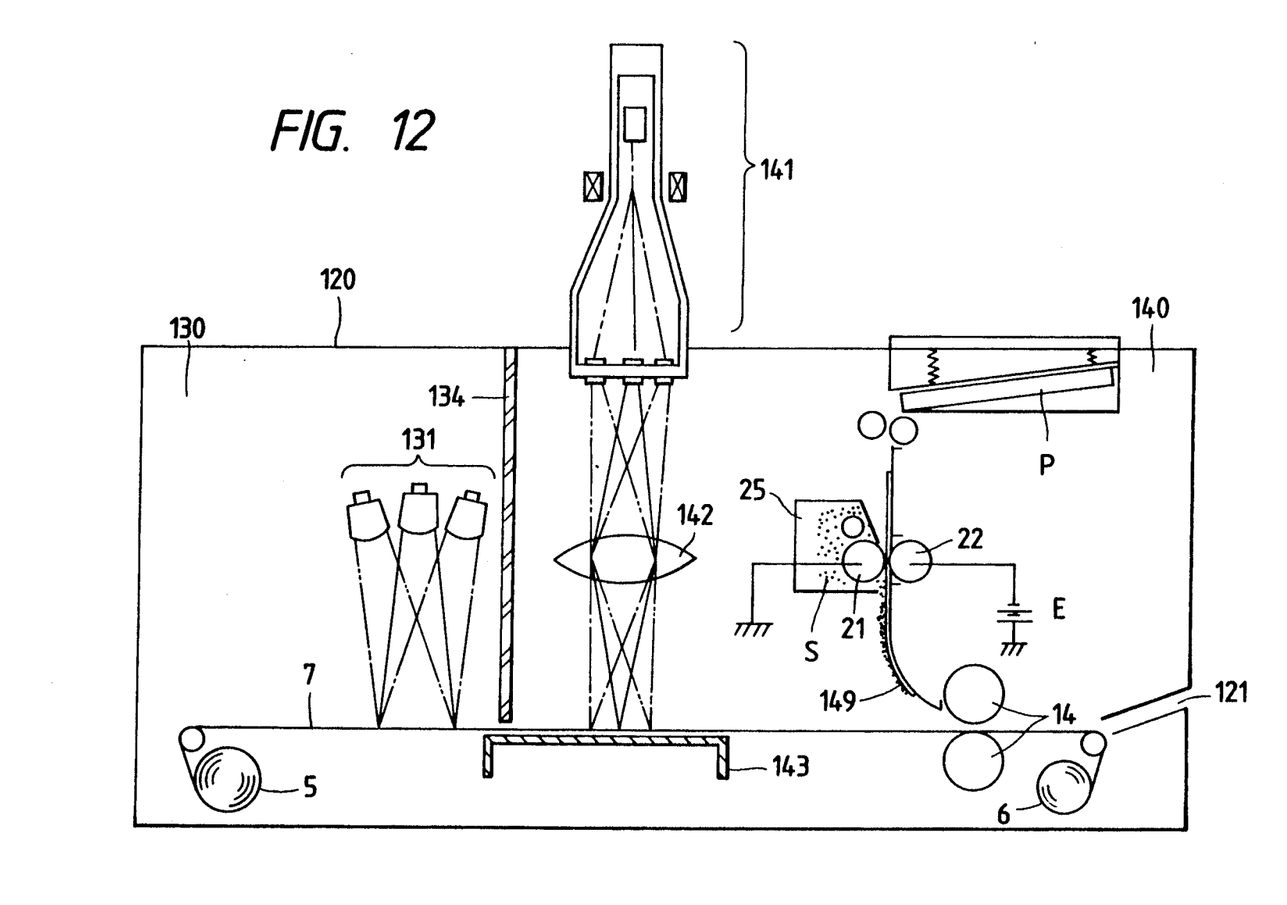
FIG. 12 shows another type of image recording invention to which the control system as shown in FIG. 11 is applied.

FIG. 12 shows another type of image recording apparatus to which this invention is applied. This embodiment will be described, representatively when the control modes as described above are performed in accordance with input data on the adjustment for the coating amount of the developer material which is inputted through the input switch by an user. The same elements as shown in FIG. 2 are represented by the same reference numerals.

In this embodiment, a latent image is formed on the microcapsule sheet 132 by a cathode-ray tube (CRT) 141, and then the latent image on the microcapsule sheet 7 is developed into a visible image on the developer sheet 149 formed of any kind of support member P coated with the developer material S.

The image recording apparatus of this embodiment includes a first dark room 130 and a second dark room 140 which are partitioned by a wall 134. The microcapsule sheet 7 is drawn from the sheet supply roller 5, travels through the first and second dark rooms 130 and 140 and is taken up by the sheet take-up roller 6. The first dark room 130 is provided with the sheet supply roller 5 and a light source 131 for performing an auxiliary exposure process, and the second dark room 140 is provided with an exposure unit comprising a CRT 141 for performing a main exposure process, a lens 142 and an exposure stand 143, a developer material coating unit comprising the carry roller 21 for coating the developer material S on the any kind of support member P, the counter electrode roller 22, the tank 25 for accommodating the developer material such as the toner and the voltage source E1 for supplying the voltage to the counter electrode roller 22, the pressure-developing rollers 14, the take-up roller 6 and the sheet outlet 121.

The operation of the image recording apparatus thus constructed will be described hereunder.

In the first dark room 130, the microcapsule sheet 7 drawn from the sheet supply roller 5 is exposed to lights having wavelengths of 450 nm, 550 nm and 650 nm by the light source 131 to conduct the auxiliary exposure process on the microcapsule sheet 7. The auxiliary exposure process is described in detail in Japanese Unexamined Published Patent Application No. 20477/1987. The microcapsule sheet 7 which has been subjected to the auxiliary exposure process is fed to the exposure stand 143 in the second dark room 140, and exposed through the lens 142 to lights corresponding to color image signals by the CRT 141 to form a latent image corresponding to the color image signals. The microcapsule sheet having the latent image thereon is fed to the pressure-developing rollers 14.

On the other hand, in the developer material coating apparatus, the developer material S in the tank 25 is triboelectrically charged and carried on the carry roller 21. Further, since the counter electrode roller 22 is supplied with the voltage having the opposite polarity to that of the charged developer material, the charged developer material on the carry roller 21 is electrostatically attracted toward the counter electrode roller 22 to electrically attach the developer material to the support member P. In this embodiment, the control system as shown in FIG. 11 is adopted. That is, the voltage control means, the rotating mechanism, the moving means and other elements are provided to the image recording apparatus of this embodiment. In this case, the user may select any one of these elements (control modes) to perform the adjustment of the coating amount of the developer material, and also may use all of the elements in combination.

The user inputs through the input switch 100 the data on, for example, the kind of the support member such as an OHP sheet, a rough sheet, an ordinary copy sheet, a coating sheet, which have different surface conditions and mechanical properties. In accordance with the input data, the control unit 41 outputs an instruction signal to the coating amount control unit 115 so that the support member P is coated with the amount of the developer material which is most suitable for the kind of the support member P. In accordance with the instruction signal, the voltage control means adjusts the voltage to be supplied to the counter electrode roller 22, the rotating mechanism adjusts the feeding speed of the support member P and the moving means adjusts the interval between the carry roller 21 and the counter electrode roller 22, respectively, to adjust the coating amount of the developer material S on the support member P. Of course, the control modes as described above may be used individually or in combination.

The support member P coated with the optimum amount of the developer material S is developed under pressure while contacted with the exposed microcapsule sheet 7 under pressure to thereby form a visible image on the support member P, and then the support member P having the visible image is discharged through the sheet outlet 121 to an outside of the apparatus 120.

In the control unit as described above may provided with an operational unit for determining the optimum coating amount of the developer material corresponding to the input data on the environmental conditions, and the characteristics of the support member such as the thickness of the support member, the kind of the support member, etc. The control unit performs the various control modes in accordance with the operation result of the operational unit.

As described above, according to the developer material coating apparatus of this invention, the constant or optimum amount of the developer material can be coated on the support member at all times to obtain a developer material layer having a constant coating amount or having an optimum amount, irrespective of the change in the environmental conditions such as temperature, humidity, etc., the change in the thickness, kind and surface conditions of the support member, and other changes in the characteristics of the support member.

What is claimed is:

1. A developer material coating apparatus for electrostatically coating developer material on a support member under a changeable condition in a developer material coating region to form a developer sheet, comprising:

feeding means for feeding each of the support members to the developer material coating region at a feeding speed while carrying the support member thereon;

coating means for triboelectrically charging the developer material while carrying the charged developer material thereon, and electrostatically supplying the charged developer material therefrom to the support member though a gap between said feeding means and said coating means to thereby form a developer sheet, said coating means including a tank for accommodating the developer material therein and a rotatable carry roller provided at a side portion of said tank for carrying thereon and feeding the charged developer material to the developer material coating region; wherein said feeding means includes a rotatable counter electrode roller supplied with a voltage having the opposite polarity of that of the charged developer material for electrostatically attracting the charged developer material with an electric field occurring in the gap between said carry roller and said counter electrode roller, and a carry belt for carrying each of the support members thereon and feeding each support member to the developer material coating region; and control means for controlling a predetermined amount of the developer material to be coated on the support member in the developer material coating region so that the developer material coated on the support member has a predetermined thickness even if the changeable condition is changed, said control means including a detector for detecting the thickness of the support members carried on said carry belt and outputting a detection signal representing the thickness, and a control unit for changing at least one of the feeding speed of the support member, a rotational speed of said counter electrode roller, a rotational speed of said carry roller, an interval in the gap between the carry roller and the counter electrode roller and an intensity of the electric field occurring in the gap, so that the predetermined amount of the developer material is coated on the support member.

2. A developer material coating apparatus as claimed in claim 1, wherein said control means comprises a detector for detecting a change in the temperature and humidity within said apparatus and outputting a detection signal representing the change, and a control unit for changing in accordance with the detection signal at least one of the feeding speed of the support member, a rotational speed of said counter electrode roller, a rotational speed of said carry roller, an interval in the gap between the carry roller and the counter electrode roller and an intensity of the electric field so that the predetermined amount of the developer material is coated on the support member.

3. A developer material coating apparatus as claimed in claim 2, wherein the predetermined amount is a constant amount.

4. A developer material coating apparatus as claimed in claim 2, wherein said control unit changes the voltage to be supplied to said counter electrode roller to change the intensity of the electric field.

5. A developer material coating apparatus as claimed in claim 2, wherein said coating means further comprises a moving means for moving said tank with said carry roller in such a direction that said carry roller approaches to or goes away from said counter electrode roller, whereby the interval of the gap is changed.

6. A developer material coating apparatus as claimed in claim 1, wherein the predetermined amount is a constant amount.

7. A developer material coating apparatus as claimed in claim 1, wherein said control unit changes the voltage to be supplied to said counter electrode roller to change the intensity of the electric field.

8. A developer material coating apparatus as claimed in claim 1, wherein said coating means further comprises a moving means for moving said tank in such a direction that said carry roller approaches to or goes away from said counter electrode roller, whereby the interval of the gap is changed.

9. A developer material coating apparatus as claimed in claim 1, wherein said control means comprises a data input unit for inputting data related to a particular support member fed therethrough, and a control unit for changing in accordance with the input data at least one of the feeding speed of the support member, a rotational speed of said counter electrode roller, a rotational speed of said carry roller, an interval in the gap between the carry roller and the counter electrode roller and an intensity of the electric field so that the predetermined amount of the developer material is coated on the support member.

10. A developer material coating apparatus as claimed in claim 9, wherein the predetermined amount is an amount changeable in accordance with the kind of the support member.

11. A developer material coating apparatus as claimed in claim 9, wherein said control unit changes the voltage to be supplied to said counter electrode roller to change the intensity of the electric field.

12. A developer material coating apparatus as claimed in claim 11, wherein said coating means further comprises a moving means for moving said tank in such a direction that said carry roller approaches to or goes away from said counter electrode roller, whereby the interval of the gap is changed.

13. A developer material coating apparatus as claimed in claim 1, wherein the changeable condition comprises at least one of an environmental condition of temperature and humidity, a thickness of the support member, and a kind of the support member.

* * * * *